(12) United States Patent
Karnopp et al.

(10) Patent No.: US 8,687,372 B2
(45) Date of Patent: Apr. 1, 2014

(54) FLEXIBLE CIRCUIT ASSEMBLY WITH WIRE BONDING

(75) Inventors: Roger J. Karnopp, Eagan, MN (US); Gregory M. Drexler, Minnetonka, MN (US); Gregory J. Whaley, Woodbury, MN (US)

(73) Assignee: Lockheed Martin Corporation, Bethesda, MD (US)

( * ) Notice: Subject to any disclaimer, the term of this patent is extended or adjusted under 35 U.S.C. 154(b) by 299 days.

(21) Appl. No.: 13/311,724

(22) Filed: Dec. 6, 2011

(65) Prior Publication Data

US 2013/0141880 A1    Jun. 6, 2013

(51) Int. Cl.
*H05K 1/02*    (2006.01)

(52) U.S. Cl.
USPC ........... 361/749; 174/254; 174/261; 174/267; 361/758; 361/770; 361/777

(58) Field of Classification Search
USPC .......... 174/254, 261, 267; 361/749, 758, 770, 361/777
See application file for complete search history.

(56) References Cited

U.S. PATENT DOCUMENTS

| | | | | |
|---|---|---|---|---|
| 6,056,448 A | * | 5/2000 | Sauter et al. | 385/92 |
| 6,356,686 B1 | * | 3/2002 | Kuczynski | 385/39 |
| 6,652,159 B2 | * | 11/2003 | Chan et al. | 385/92 |
| 6,685,364 B1 | * | 2/2004 | Brezina et al. | 385/92 |
| 7,854,554 B1 | | 12/2010 | Karnopp et al. | |
| 8,070,366 B1 | | 12/2011 | Thorson et al. | |
| 2004/0146253 A1 | * | 7/2004 | Wang et al. | 385/93 |
| 2011/0052124 A1 | | 3/2011 | Karnopp et al. | |
| 2011/0058818 A1 | | 3/2011 | Karnopp et al. | |

* cited by examiner

*Primary Examiner* — Anatoly Vortman
*Assistant Examiner* — Jacob Crum
(74) *Attorney, Agent, or Firm* — Hamre, Schumann, Mueller & Larson, P.C.

(57) ABSTRACT

A flexible circuit assembly that includes a flexible circuit substrate. A spacer is attached to a first side surface of the substrate, and a die carrier is attached to the opposite side surface of the substrate. The die carrier includes one or more photonic die mounted thereon that face an opening formed through the substrate so that the photonic die transmits and/or receives optical signals through the opening. Wire bonds electrically connect the photonic die to an electrical pad on the first side surface of the substrate. The spacer helps to space the wire bonds from an optical connector that connects to the flexible circuit assembly, so that the wire bonds do not interfere with the mechanical connection between the flexible circuit assembly and the optical connector.

12 Claims, 5 Drawing Sheets

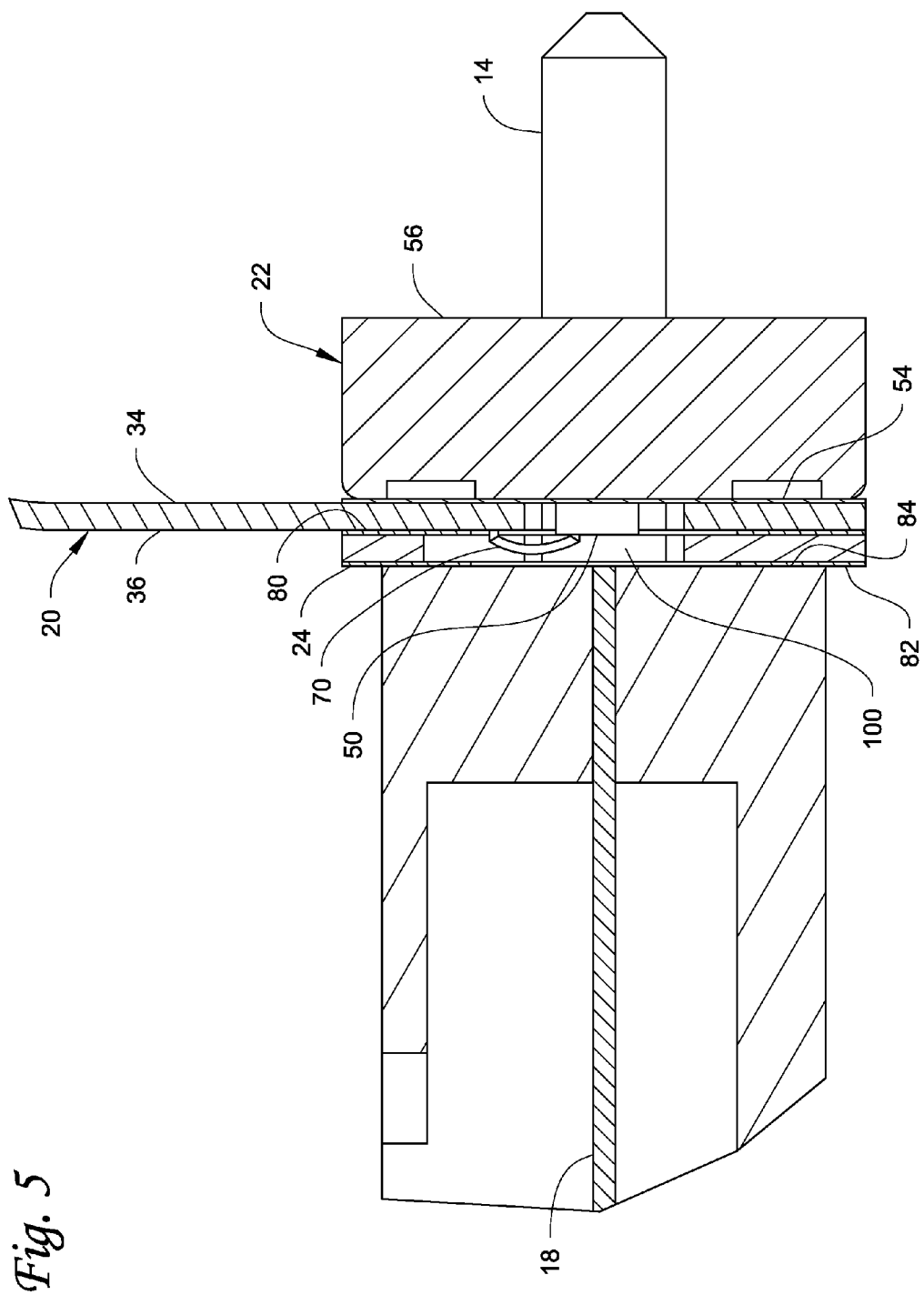

FLEXIBLE CIRCUIT ASSEMBLY WITH WIRE BONDING

FIELD

This disclosure relates to a flexible circuit assembly having photonics that optically connect to an optical connector with reduced optical attenuation and having improved electrical connection of the photonics to the flexible circuit assembly.

BACKGROUND

One known flexible circuit assembly with photonics includes a fiber optic transmitter die, such as a vertical cavity surface emitting laser (VCSEL), and a fiber optic receiver die, such as a PIN diode array (PDA), mounted on a die carrier. The die carrier is mounted on the flexible circuit substrate so that the transmitter die and the receiver die optically transmit or receive optical signals through the material of the flex circuit substrate. Examples of this known type of flexible circuit assembly are disclosed in U.S. 2011/0052124 and U.S. 2011/0058818. However, optical transmission through the flex circuit substrate material can cause attenuation of the optical signals.

In the known flexible circuit assembly in the preceding paragraph, a flip chip assembly technique has been used to electrically attach the photonics to the electrical circuitry of the flexible circuit. The transmitter die and receiver die are bumped and then "flip chipped" or scrubbed into the flexible circuit to electrically connect to the electric circuitry of the flexible circuit. In this technique, both die need to be substantially coplanar or at the same height in order to achieve adequate electrical connection. However, due to die thickness variance, this has proved to be problematic leading to an unacceptably high number of rejects due to inadequate electrical connection.

In addition, an optical epoxy under-fill is utilized between the die and the flex circuit. However, the epoxy under-fill creates problems because the epoxy tends to flow into the optical connector pin holes.

SUMMARY

A flexible circuit assembly is described that has improved electrical connection between the photonics and the electrical circuitry of the flexible circuit, as well as improved optical transmission between the photonics of the flexible circuit and an optical connector that connects to the flexible circuit assembly. The disclosed construction of the flexible circuit assembly improves the ease of manufacturing the flexible circuit assembly, improves yield when the flexible circuit assembly is formed in batches, and reduces the cost of manufacturing the flexible circuit assembly.

The flexible circuit assembly employs wire bonding between the photonics and the electrical circuitry of the flexible circuit assembly. Wire bonding is more robust and is higher in reliability compared to the conventional flip chip bump technique.

In one exemplary embodiment, a flexible circuit assembly includes a flexible circuit substrate having a first side surface and a second side surface, a first end, an opening formed through the flexible circuit substrate adjacent to the first end, and electrical circuitry. In one embodiment, at least one electrical pad is provided on the second side surface adjacent to the opening. The electrical pad is electrically connected to the electronic circuitry of the flexible circuit substrate. At least two of the electrical pads would typically be used. However, it is contemplated that in appropriate circumstances, a single electrical pad could be used.

A spacer is attached to the second side surface of the flexible circuit substrate. The spacer has a flexible circuit side surface that faces the flexible circuit substrate and an optical connector side surface that in use of the flexible circuit assembly would face an optical connector that connects to the flexible circuit assembly. In one embodiment, the spacer includes an opening therethrough, and the spacer is positioned on the second side surface so that the opening of the spacer is aligned with the opening in the flexible circuit substrate.

A die carrier is attached to the first side surface of the flexible circuit substrate. The die carrier includes at least one photonic die mounted thereon that extends into and at least partially through the opening in the substrate so that the at least one photonic die transmits or receives optical signals through the opening. The at least one photonic die does not project past the optical connector side surface of the spacer. In the preferred embodiment, two photonic dies are mounted on the die carrier, one of the photonic dies being an optical transmitter die and the other die is an optical receiver die.

Wire bonds electrically connect the photonic die(s) to the electrical pad. Further, to avoid interfering with the mechanical connection with the optical connector, the wire bonds do not project past the optical connector side surface of the spacer. As used herein, an electrical pad is any device(s) that provides electrical connection between the wire bonds and the electrical circuitry of the flexible circuit substrate.

The die carrier, the flexible circuit substrate, and the spacer include alignment pin holes that are aligned to receive alignment pins used to help connect the optical connector to the flexible circuit assembly. After the optical connector is connected to the flexible circuit assembly any gaps formed by the openings in the spacer and the substrate are filled with optical epoxy. The optical epoxy can also flow into the alignment pin holes around the alignment pins to help secure the optical connector to the flexible circuit assembly.

With this construction of the flexible circuit assembly, the optical input and/or output are on the same side of the flexible circuit substrate as the wire bonds. Any thickness variation between the dies is no longer of consequence, since the wire bonds are used to achieve the electrical connection. Further, since the optical input and/or output go through the opening in the flexible circuit substrate, attenuation of the optical signals by the substrate material is avoided.

DRAWINGS

FIG. 5 is a partial cross-sectional side view of the flexible circuit assembly connected to the optical connector.

DETAILED DESCRIPTION

Figure 1:
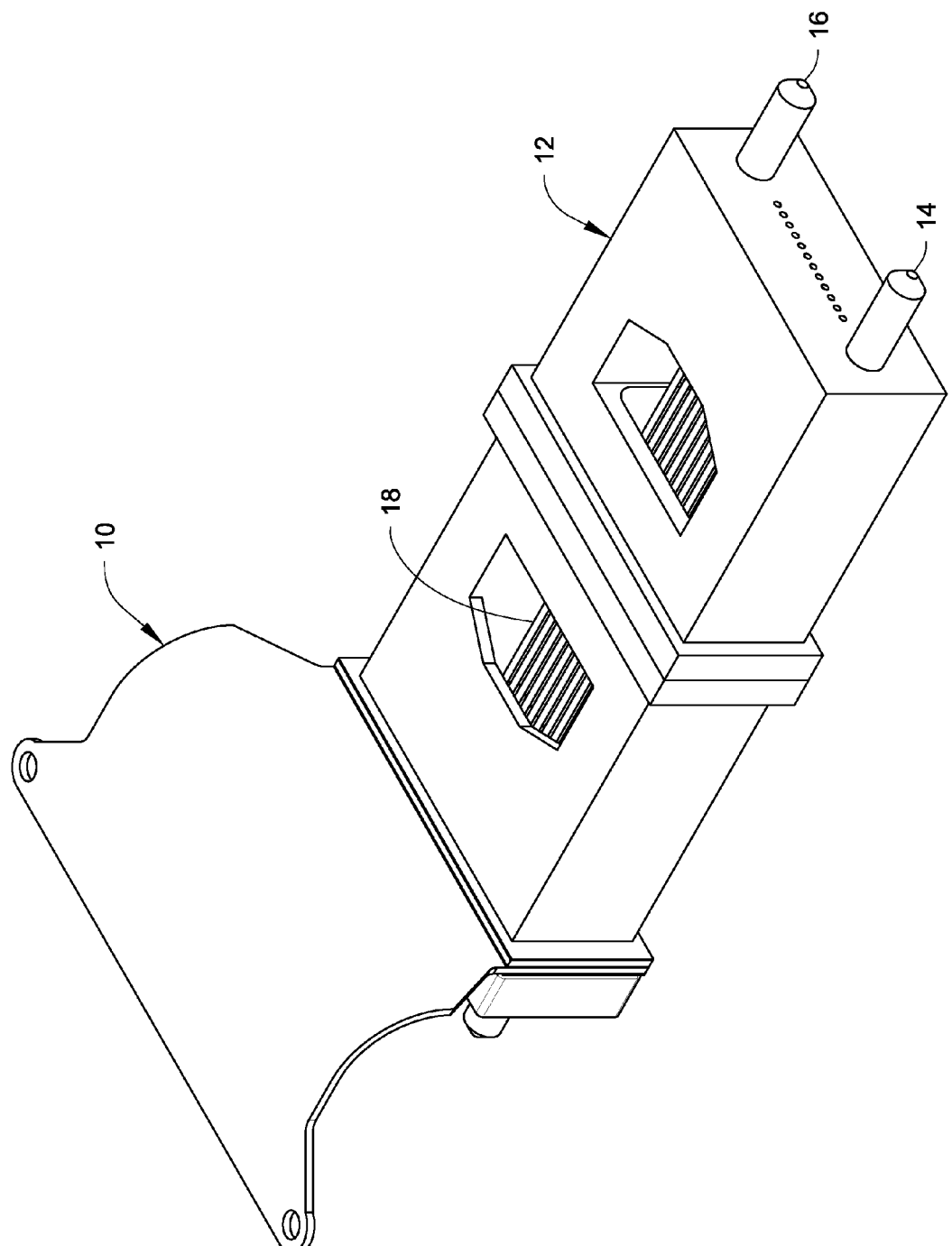
FIG. 1 illustrates the improved flexible circuit assembly described herein connected to an optical connector.

FIG. 1 illustrates an improved flexible circuit assembly 10 connected to an optical connector 12. The flexible circuit assembly 10 has improved electrical connection between the photonics and the electrical circuitry thereof, as well as improved optical transmission between the photonics of the flexible circuit assembly and the optical connector 12. A pair of alignment pins 14, 16 extend through the optical connector and the flexible circuit assembly to achieve secure connection. The use of alignment pins is well known in the art. A plurality of optical fibers 18 extend through the connector 12 from one end to the other to transmit optical signals to and from the flexible circuit assembly 10. Each end of the connector 12 also includes fiber ferrules 8 that receive opposite ends of the optical fibers 18 so as to mate with corresponding optical fiber ends on a mating optical connector or other optical component.

The optical connector 12 can be any optical connector known in the art. For example, the optical connector 12 is illustrated in FIG. 1 as being a uniferrule construction of the type described in U.S. patent application Ser. No. 12/467,398, filed on May 18, 2009, which is incorporated herein by reference in its entirety. The optical connector 12 can also be any other type of optical connector that is configured for operation with the flexible circuit assembly including, but not limited to, MT, SC, ST, FC, LC, FDDI, etc.

Figure 2:
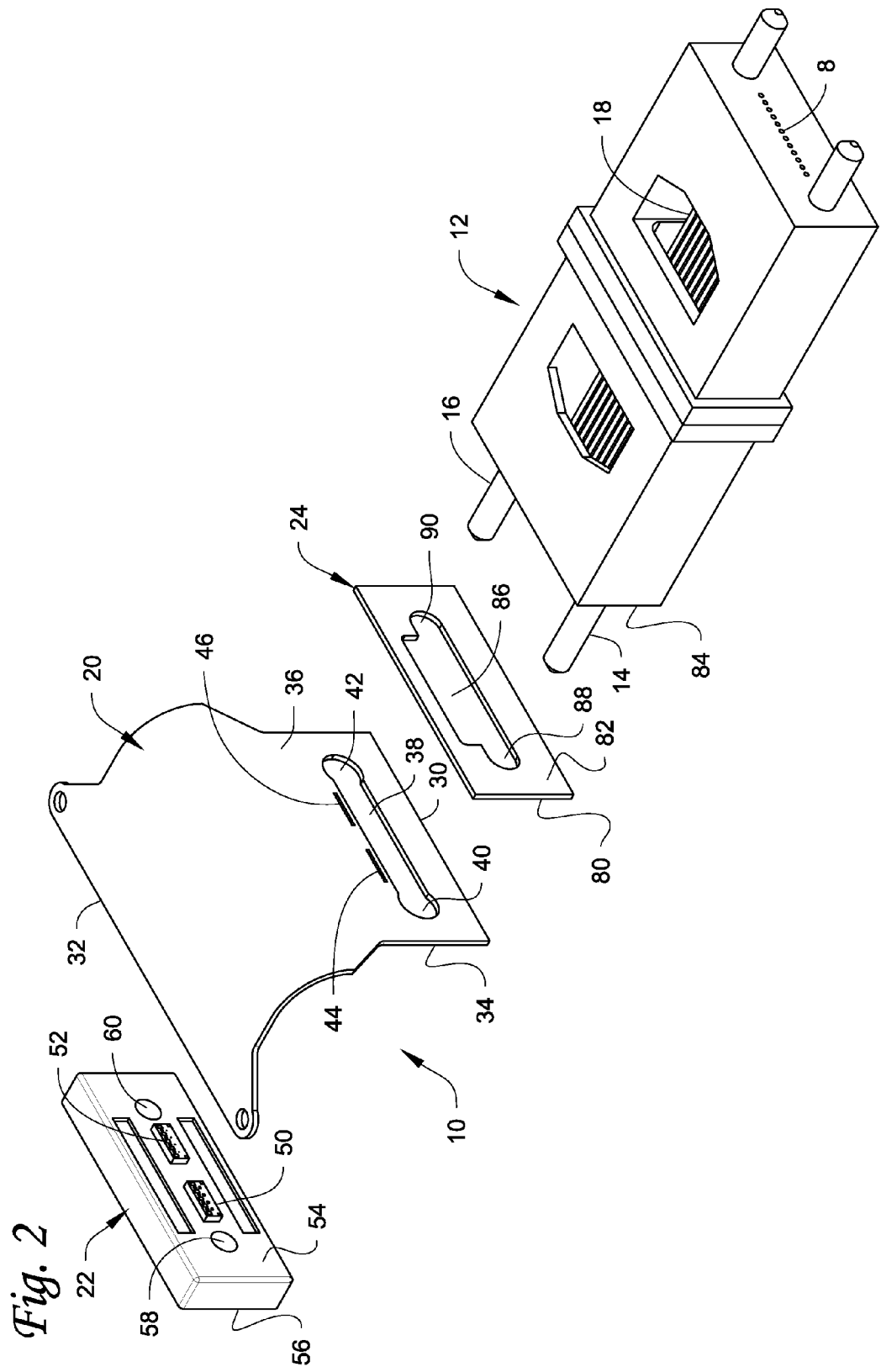
FIG. 2 is an exploded view of the improved flexible circuit assembly and the optical connector.

FIG. 2 provides an exploded view of the flexible circuit assembly 10. The assembly 10 includes a flexible circuit substrate 20, a die carrier 22, and a spacer 24. The flexible circuit substrate 20 has a generally flat ribbon-like shape with a first end 30, a second end 32 opposite the first end 30, a first, generally planar major side surface 34 opposite a second, generally planar major side surface 36. The flexible circuit substrate 20 can be any size or shape and, as the name implies, is flexible which allows for the integration of the flexible circuit assembly 10 with the optical connector 12 and with an optical transceiver assembly. The flexible circuit substrate 20 can be made of, for example, a polyimide material.

In one embodiment, the die carrier 22 material can have a coefficient of thermal expansion that is matched to the coefficient of thermal expansion of the optical connector 12 to maintain submicron optical alignment over a range of temperatures. In another embodiment, the thickness of the spacer 24 is selected to protect the wire bonds discussed further below, and also to provide a designed optical attenuation based on the distance and optical properties of the epoxy fill discussed further below.

An opening 38 is formed through the flexible circuit substrate 20 adjacent to the first end 30. The opening 38 is sized to allow unattenuated optical transmission to and from one or more photonic dies on the flexible circuit assembly and the fiber ferrules 8 on the end of the connector 12. The term unattenuated means that the optical signals are not transmitted through the material that forms the substrate 20.

In addition, alignment pin holes 40, 42 extend through the flexible circuit substrate 20 on opposite sides of the opening 38. In the illustrated embodiment, the pin holes 40, 42 are contiguous with the opening 38 to form a single large opening therewith. However, it is contemplated that the pin holes 40, 42 could be separate from and non-contiguous with the opening 38, so that a web of substrate material is positioned between the opening 38 and the hole 40 and another web of substrate material is positioned between the opening and the hole 42.

Regardless of whether the opening 38 is contiguous with the holes 40, 42 or not, the opening 38 is positioned and sized to allow the light of optical signals to and from photonics on the die carrier 22 to shine through the opening 38, unattenuated by the material of the substrate. The pin holes 40, 42 are positioned and sized to receive the alignment pins 14, 16 therethrough. The opening 38, as well as the contiguous opening formed by the opening 38 and the holes 40, 42, is smaller in area than the end face of the connector 12.

With continued reference to FIG. 2, at least one group of electrical pads 44 is provided on the second side surface 36 adjacent to the opening 38. In the illustrated embodiment, a second electrical group of electrical pads 46 is provided on the second side surface adjacent to the opening 38, next to the electrical pads 44. As used herein, adjacent to the opening is intended to mean that the electrical pad groups 44, 46 are close enough to the opening 38 to permit wire bonds from photonics on the die carrier 22 to be electrically connected to the electrical pads. So the physical locations of the electrical pads can vary from that illustrated in FIG. 2, as long as the position of the electrical pads permit the wire bonding discussed below.

The electrical pad groups 44, 46 are electrically connected by vias to electronic circuitry embedded within the flexible circuit substrate 20. The construction of a flexible circuit substrate with embedded electronic circuitry is known in the art. The electrical pad groups 44, 46, which are electrically connected to the electronic circuitry of the substrate 20, provide a convenient location on the second side surface 36 for electrically connecting wire bonds from photonics on the die carrier to the pad groups 44, 46 and thus to the embedded electronic circuitry in the substrate 20. As used herein, the term electrical pad or electrical pad group is intended to encompass any device(s) that provides electrical connection between the wire bonds and the electrical circuitry of the flexible circuit substrate.

Although two separate electrical pad groups 44, 46 are illustrated in FIG. 2, a single electrical pad group could be used, with the single electrical pad group having separate electrical contact areas for connection to the photonics on the die carrier. In addition, in the event that the die carrier includes only a transmit or receive photonic element, a single electrical pad group could be used for connection with the single photonic element on the die carrier.

With continued reference to FIG. 2, the die carrier 22 is configured to act as a support for two photonic dies 50, 52 that are mounted on the die carrier 22. The photonic die 50 is an optical transmitter die that transmit optical signals and the die 52 is an optical receiver die that receives optical signals. The optical transmitter die can be, for example, a vertical cavity surface emitting laser (VCSEL), and the optical receiver die can be, for example, a PIN diode array (PDA).

The carrier 22 can have any configuration that is suitable for carrying out the support function for the dies 50, 52. In the illustrated embodiment, the carrier 22 is a generally rectangular block that can be made of, for example, a non-conductive material. The block has a first, generally planar major surface 54, a second, generally planar major surface 56 opposite the first major surface 54, and a thickness defined between the surfaces 54, 56.

The carrier 22 also includes alignment pin holes 58, 60 that extend through the carrier 22 from the first major surface 54 to the second major surface 56 on opposite sides of the dies 50, 52.

With reference to FIGS. 2-5, the die carrier 22 is configured such that the major surface 54 attaches to the side surface 34 of the flexible circuit substrate 20 at the first end 30. The width of the die carrier 22 is approximately equal to the width of the substrate 20 at the first end 30 so that the edges of the substrate do not overhang the die carrier 22. Also, the bottom edge of the die carrier is approximately aligned with the bottom edge of the first end of the substrate.

Further, the dies 50, 52 are positioned on the die carrier 22 such that when the die carrier is attached to the substrate 20, the dies 50, 52 extend into and at least partially through the opening 38 in the substrate 20. In the illustrated embodiment, the dies 50, 52 are mounted on and extend above the surface 54. However, the dies 50, 52 could be recessed partially, or entirely, into the carrier so that the dies extend into the opening 38 a lesser extent or they do not extend into the opening 38 at all.

Figure 4:
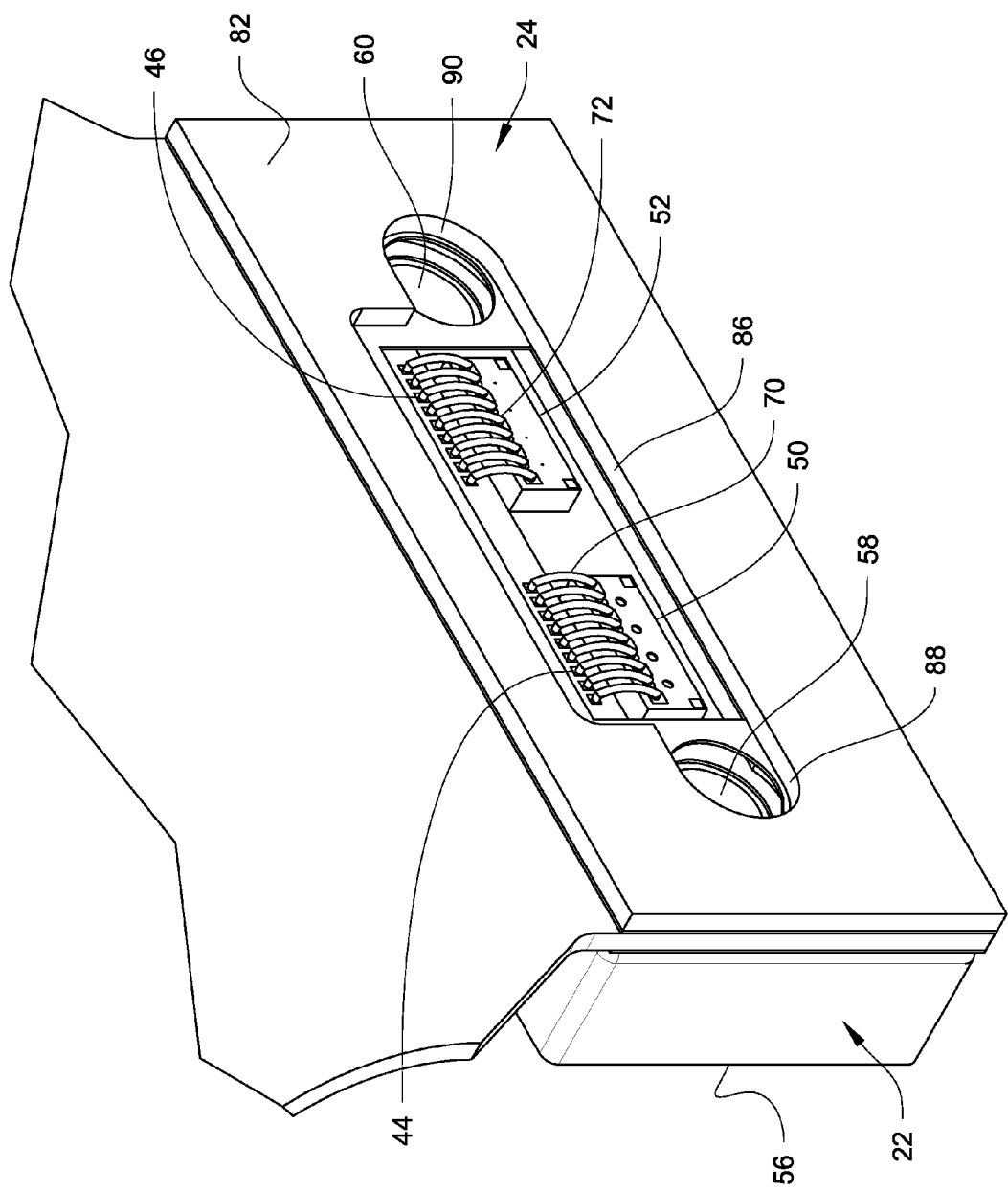
FIG. 4 is a close up view of the improved flexible circuit assembly.

As best seen in FIGS. 4 and 5, the dies 50, 52 extend entirely through the opening 38 so that the top surfaces of the dies 50, 52 are approximately level with the second side surface 36 of the substrate. However, the dies do not project past the optical connector side surface of the spacer 24 which will be described further below.

Because the dies 50, 52 are disposed in the opening 38 or positioned to transmit and receive through the opening 38, the optical signals transmitted by the die 50 and the optical signals received by the die 52 do not travel through the material of the substrate 20. As a result, attenuation of the optical signals is reduced.

Also, when the carrier 22 is mounted on the substrate 20, the alignment pin holes 58, 60 are aligned with the alignment pin holes 40, 42, respectively, in the substrate 20. Therefore, the alignment pins 14, 16 can extend into and through the alignment pin holes 58, 60 as shown in FIGS. 1 and 5.

Figure 3:
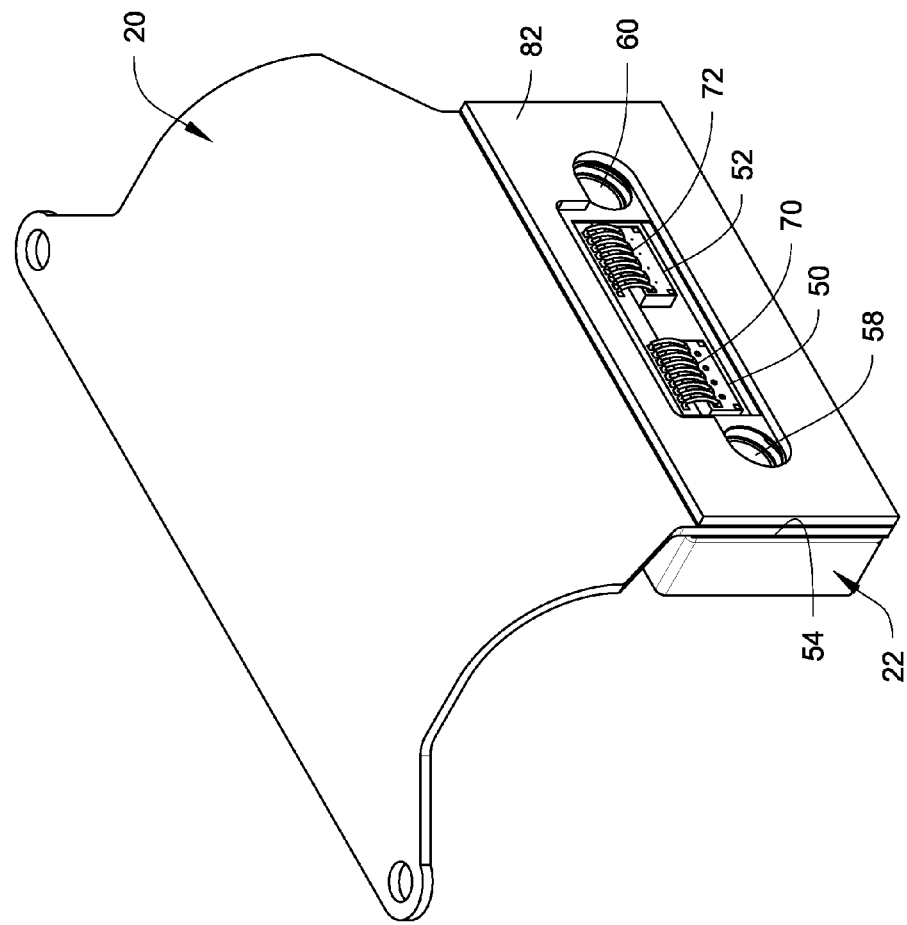
FIG. 3 is a perspective view of the improved flexible circuit assembly.

As shown in FIGS. 3-5, wire bonds 70, 72 electrically connect the dies 50, 52 to the electrical pad groups 44, 46, respectively. The wire bonds 70, 72 are electrically conductive wires including, but not limited to, copper, gold, aluminum alloy or other metal wires, suitable for making electrical connection between the dies and the electrical pads. Wire bonding between elements is a known technique.

As best seen in FIG. 5, when the flexible circuit assembly is assembled, the wire bonds 70, 72 do not project past the optical connector side surface of the spacer 24 which will be described further below.

Although a transmitter die 50 and a receiver die 52 are described, it is contemplated that different photonic elements, as well as a different number of photonic elements, could be employed. For example, there could be two transmitter dies and/or two receiver dies. There could be more than two dies. There could be a single die, such as a transmitter die or a receiver die, or a die element that performs both transmit and receive functions. Various configurations of photonic element(s) are possible and within the scope of the described invention.

Returning to FIG. 2, the spacer 24 can be one or more elements that space the end face of the optical connector 12 from the wire bonds 70, 72 so that the wire bonds do not interfere with mechanical connection between the flexible circuit assembly and the optical connector. In the illustrated embodiment, the spacer 24 is a generally rectangular plate that is shaped similar to the end 30 of the substrate 20 and shaped similar to the die carrier 22. The spacer 24 has a flexible circuit side surface 80 that faces the flexible circuit substrate 20 when assembled, and an optical connector side surface 82 that faces the optical connector 12 when assembled. In particular, in use, the side surface 80 engages the second side surface 36 of the substrate 20, while the side surface 82 engages an end face 84 of the optical connector 12.

The spacer 24 also includes an opening 86 therethrough that is positioned such that in use the opening 86 is aligned with the opening 38 in the flexible circuit substrate. In addition, alignment pin holes 88, 90 extend through the spacer on opposite sides of the opening 86. In the illustrated embodiment, the alignment pin holes 88, 90 are contiguous with the opening 86 to form a single large opening therewith. However, it is contemplated that the pin holes 88, 90 could be separate from and non-contiguous with the opening 86, so that a web of material is positioned between the opening 86 and the hole 88 and another web of substrate material is positioned between the opening and the hole 90.

Regardless of whether the opening 86 is contiguous with the holes 88, 90 or not, the opening 86 is positioned and sized to allow the light of optical signals to and from the photonic elements on the die carrier 22 to shine through the opening 86 to and from the photonic dies and the ferrules 8 on the connector. The alignment pin holes 88, 90 align with the alignment pin holes 40, 58 and 42, 60 and are sized to receive the alignment pins 14, 16 therethrough.

The wire bonds 70, 72 extend into the opening 86 in the spacer 24. However, as best seen in FIG. 5, the thickness of the spacer 24 is such that the wire bonds 70, 72 do not project past the optical connector side surface 82 of the spacer 24. As a result, the end face 84 of the optical connector 12 can cleanly mate with the side surface 82 without interference from the wire bonds, to achieve planarity between the optical connector and the dies of the flexible circuit assembly.

After the optical connector 12 is connected to the flexible circuit assembly 10, any air gaps between the optical connector 12 and the flexible circuit assembly 10 are filled with optical epoxy 100 (see FIG. 5). The air gaps are formed by the openings 38, 86 in the substrate 20 and the spacer 24, respectively, and any other air gaps that may exist between the optical connector and the flexible circuit assembly. In addition, the optical epoxy can also flow into the alignment pin holes 40, 42, 58, 60, 88, 90 around the alignment pins 14, 16 to help secure the optical connector to the flexible circuit assembly. The described construction of the assembly 10 including the optical epoxy 100 seals the die 50, 52 from environmental issues. This significantly improves long term life and reliability of the die 50, 52.

The flexible circuit assembly 10 can be manufactured as follows. A sheet containing a plurality, for example tens or hundreds, of the flexible circuit substrates 20 described herein is provided. Spacers that ultimately form each spacer 24 are then attached to the sheet, for example using an adhesive. Electrical testing is then conducted on each flexible circuit substrate on the sheet to determine which substrates have acceptable electrical performance and which substrates do not have acceptable electrical performance. The acceptable substrates are then cut from the sheet.

Also, the dies 50, 52 are attached to the die carriers 22. This attachment of the dies to the die carrier can occur prior to, subsequent to, or at the same time as the processing of the sheet described in the preceding paragraph.

The die carrier 22 is then attached to one of the acceptable substrates 20, for example using an adhesive. The dies 50, 52 are then wire bonded to the electrical pad groups 44, 46 on the substrate. The flexible circuit assembly is then mechanically connected with the optical connector 12 as shown in FIG. 1, and optical and electrical testing is performed to determine if the performance of the flexible circuit assembly and optical connector is adequate. If the performance is adequate, the optical epoxy is applied to fill the air gaps and to secure the connection between the optical connector and the flexible circuit assembly.

It is contemplated that other assembly procedures can be used, including mounting an individual spacer to an individual substrate 20 rather than using a sheet of substrates.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A flexible circuit assembly, comprising:
   a flexible circuit substrate having a first side surface and a second side surface, a first end, an opening formed through the flexible circuit substrate adjacent to the first end, and electrical circuitry;
   a spacer attached to the second side surface, the spacer having a flexible circuit side surface that is connected to and faces the second side surface of the flexible circuit substrate and an optical connector side surface;
   a die carrier attached to the first side surface, the die carrier including at least one photonic die mounted thereon that extends into and at least partially through the opening, the at least one photonic die transmitting or receiving optical signals through the opening, and the at least one photonic die does not project past the optical connector side surface of the spacer; and
   wire bonds electrically connecting the at least one photonic die to the electrical circuitry, and the wire bonds do not project past the optical connector side surface of the spacer.

2. The flexible circuit assembly of claim 1, further comprising:
   at least one electrical pad on the second side surface adjacent to the opening and electrically connected to the electrical circuitry;
   and the wire bonds are attached to the at least one electrical pad.

3. The flexible circuit assembly of claim 2, comprising two of the electrical pads on the second side surface adjacent to the opening;
   two of the photonic dies mounted on the die carrier, one of the photonic dies is an optical transmitter die and the other die is an optical receiver die, each of the dies extends into and at least partially through the opening, and the dies do not project past the optical connector side surface of the spacer; and
   wire bonds electrically connecting the dies to a corresponding one of the electrical pads, and the wire bonds do not project past the optical connector side surface of the spacer.

4. The flexible circuit assembly of claim 1, wherein the spacer includes an opening therethrough, and the spacer is positioned on the second side surface so that the opening of the spacer is aligned with the opening in the flexible circuit substrate, and the wire bonds extend into the opening in the spacer.

5. The flexible circuit assembly of claim 4, wherein the die carrier includes alignment pin holes, the flexible circuit substrate includes alignment pin holes, and the spacer includes alignment pin holes, and the alignment pin holes in the die carrier, in the flexible circuit substrate and in the spacer are aligned with each other.

6. The flexible circuit assembly of claim 5, wherein the alignment pin holes in the flexible circuit substrate are contiguous with the opening in the flexible circuit substrate to form a single opening therewith, and the alignment pin holes in the spacer are contiguous with the opening in the spacer to form a single opening therewith.

7. A flexible circuit assembly, comprising:
   a flexible circuit substrate having a first side surface and a second side surface, an opening formed through the flexible circuit substrate adjacent to the first end, and a pair of alignment pin holes;
   a spacer attached to the second side surface, the spacer having a flexible circuit side surface that is connected to and faces the second side surface of the flexible circuit substrate and an optical connector side surface, and the spacer includes an opening therethrough that is aligned with the opening in the flexible circuit substrate, and alignment pin holes in the spacer that are aligned with the alignment pin holes in the flexible circuit substrate;
   a die carrier attached to the first side surface, the die carrier including an optical transmitter die and an optical receiver die mounted thereon and positioned to transmit and receive, respectively, optical signals through the openings in the flexible circuit substrate and the spacer, and alignment pin holes that are aligned with the alignment pin holes in the flexible circuit substrate and in the spacer; and
   wire bonds electrically connecting the optical transmitter die and the optical receiver die to the second side surface of the flexible circuit substrate, and the wire bonds do not project past the optical connector side surface of the spacer to avoid mechanical interference of the wire bonds when mechanically connecting the flexible circuit assembly to an optical connector.

8. The flexible circuit assembly of claim 7, wherein the optical transmitter die and the optical receiver die are attached to an upper surface of the die carrier, and the upper surface is attached to the first side surface of the flexible circuit substrate.

9. The flexible circuit assembly of claim 8, further comprising two electrical pads on the second side surface of the flexible circuit substrate adjacent to the opening therethrough, and the wire bonds electrically connect the optical transmitter die and the optical receiver die to a corresponding one of the electrical pads.

10. A flexible circuit assembly, comprising:
    a flexible circuit substrate having a first side surface and a second side surface, an opening formed through the flexible circuit substrate adjacent to the first end, and a pair of alignment pin holes;
    electrical pads on the second side surface of the flexible circuit substrate adjacent to the opening therethrough;
    a die carrier attached to the first side surface, the die carrier including an optical transmitter die and an optical receiver die mounted thereon and positioned to transmit and receive, respectively, optical signals through the opening in the flexible circuit substrate, and alignment pin holes that are aligned with the alignment pin holes in the flexible circuit substrate; and
    wire bonds electrically connecting the optical transmitter die and the optical receiver die to a corresponding one of the electrical pads on the second side surface of the flexible circuit substrate, and the wire bonds extend through the opening in the flexible circuit substrate.

11. The flexible circuit assembly of claim 10, wherein the optical transmitter die and the optical receiver die are attached to an upper surface of the die carrier, and the upper surface is attached to the first side surface of the flexible circuit substrate.

12. The flexible circuit assembly of claim 10, further comprising a spacer attached to the second side surface of the flexible circuit substrate to prevent mechanical interference between the wire bonds and an optical connector to be connected to the flexible circuit assembly.

* * * * *